United States Patent [19]

Ulrich et al.

[11] Patent Number: 5,307,479
[45] Date of Patent: Apr. 26, 1994

[54] METHOD FOR MULTI-DOMAIN AND MULTI-DIMENSIONAL CONCURRENT SIMULATION USING A DIGITAL COMPUTER

[75] Inventors: Ernst G. Ulrich, Bedford; Karen P. Lentz, Andover, both of Mass.

[73] Assignee: Digital Equipment Corporation, Maynard, Mass.

[21] Appl. No.: 24,878

[22] Filed: Mar. 1, 1993

Related U.S. Application Data

[63] Continuation of Ser. No. 649,402, Feb. 1, 1991, abandoned.

[51] Int. Cl.$^5$ ............................................. G06F 9/455
[52] U.S. Cl. ................................ 395/500; 364/221.2; 364/916.3
[58] Field of Search ........................................ 395/500

[56] References Cited

U.S. PATENT DOCUMENTS

| | | | |
|---|---|---|---|
| 4,412,288 | 10/1983 | Herman | 364/413 |
| 4,769,817 | 9/1988 | Krohn | 371/23 |
| 4,792,913 | 12/1988 | Buckland | 364/602 |
| 4,901,260 | 2/1990 | Lubachevsky | 364/578 |
| 4,926,327 | 5/1990 | Sidley | 364/412 |

OTHER PUBLICATIONS

IEEE Transactions on Computer Aided Design of Integrated Circuits and Systems, vol. 6, No. 6, Nov. 1987, New York US pp. 1006–1012; Gai et al: 'advances in concurrent multilevel simulation'.

IEEE Transactions on Computer Aided Design of Integrated Circuits and Systems, vol. 7, No. 9, Sep. 1988, New York US pp. 1005–1016; Gai et al: 'a current multi-level simulator'.

International Test Conference Proceedings IEEE Sep. 12–14, 1988 Washington D.C. US pp. 574–581; Machlin et al: 'switch-level concurrent fault simulation based on a general purpose list traversal mechanism'.

Primary Examiner—David Y. Eng
Attorney, Agent, or Firm—Kenneth F. Kozik; A. Sidney Johnston; Albert P. Cefalo

[57] ABSTRACT

A simulation method allowing an experimenter to model a real-world situation in order to learn something about it. The method permits interaction of concurrent experiments through interaction between different variables during a single simulation run on a computer having at least one central processing unit.

4 Claims, 4 Drawing Sheets

| DOMAINS | | A | | | |
|---|---|---|---|---|---|
| | | a0 | a1 | a2 | am |
| | b0 | R=a0-b0 | a1-b0 | a2-bo | am-bo |
| B | b1 | a0-b1 | – | a2-b1 | am-b1 |
| | | – | – | – | – |
| | bn | a0-bn | – | a1-bn | am-bn |

| DOMAINS | a0 | a1 | a2 | am |
|---|---|---|---|---|
| b0 | R=a0-b0 | — | — | — |
| b1 | — | — | a2-b1 | — |
| | — | — | — | — |
| bn | — | — | — | — |

| DOMAINS | a0 | a1 | a2 | am |
|---|---|---|---|---|
| b0 | R=a0-b0 | a1-b0 | a2-b0 | am-b0 |
| b1 | a0-b1 | — | a2-b1 | am-b1 |
| | — | — | — | — |
| bn | a0-bn | — | a1-bn | am-bn |

B

METHOD FOR MULTI-DOMAIN AND MULTI-DIMENSIONAL CONCURRENT SIMULATION USING A DIGITAL COMPUTER

This application is a continuation of application Ser. No. 07/649,402, filed Feb. 1, 1991 now abandoned.

RELATED APPLICATIONS

The present patent application is related to the following application filed at the same time as this application:

U.S. patent application Ser. No. 07/649,399, by Ernst Guenther Ulrich, Karen Panetta Lentz, and Michael M. Gustin, entitled METHOD FOR TESTING, DEBUGGING, AND COMPARING COMPUTER PROGRAMS USING CONCURRENT SIMULATION OF PROGRAM PATHS.

FIELD OF THE INVENTION

This present invention is related to simulating a variety of experiments using a digital computer, and in particular, to an improved method of running side-by-side simulation of related experiments within one run on a digital computer.

BACKGROUND OF THE INVENTION

A simulation method is one that attempts to model a real-world situation in order to learn something about it. Each object and action in the real situation has its counterpart in the computer method. If the simulation is accurate, that is, if the computer method successfully mirrors the real world, then the result of the computer method should mirror the result of the actions being simulated. Thus it is possible to understand what occurs in the real-world situation without actually observing its occurrence.

Based on the power of the computer and on the ability to build adequate models of reality, the simulation of experiments has become an increasingly effective and often a superior substitute for physical experimentation. For example, the building and testing of engineering prototypes is an experimentation effort that is done more and more in terms of models and simulations rather than by conventional means, i.e. the actual building on scaled-down models.

Concurrent Simulation (CS) is the simultaneous, side-by-side simulation of related experiments using one computer run. CS is a method that runs on conventional computers, performing concurrent experiments without concurrent hardware. That is to say, that CS uses a computer containing at least one central processing unit (CPU) rather than multiple CPU's. It applies and is limited to systems simulated with discrete events. Typically 10 to 1,000 times faster than serial (one-at-a-time) simulation of single experiments, its speed is largely based on the number of and similarities between experiments. CS dates from about 1970 and was first developed for fault simulation of gate-level digital networks. Over the years it has increased in generality and, more recently, evolved into a simulation methodology. Whenever discrete event simulation is the method chosen to solve a particular problem, CS is usually better than serial simulation. CS has several advantages over serial simulation.

First, all experiments advance synchronously through the dimension of time, and CS is therefore analogous to a race in which the experiments are competitors. This constitutes a race methodology and a comparative style of simulation. This methodology and the speed of CS permit the solution of problems more difficult and larger than with serial simulation. A simulation strategy based on this methodology and comparative style is to simulate and observe related experiments which are initially the same but later become different.

Second, observation, which is awkward and costly for serial simulation, is handled easily and elegantly with CS. The experiments are observed comparatively, and can be compared in exact detail as well statistically. Statistical "signatures" are maintained and periodically analyzed for all experiments.

Next, CS offers speed in various forms. Relative to serial simulation, experiments are compressed into a single run. The idle time between serial simulations is avoided and a simulation project is strategically accelerated. Also, due to the number of concurrent experiments, due to their similarity, and the similarity between them and a reference experiment, the CPU time, as mentioned previously, is typically 10 to 1,000 times less than the equivalent serial simulations. Further, based on the analysis of signatures, the initial reference experiment may often be replaced with a more central one which reduces the average differences between reference and concurrent experiments and gains additional speed.

Lastly, CS provides accuracy and generality. In fields such as biology and chemistry, for example, it is desirable to perform related and similar physical experiments in parallel, but it is normally too costly due to labor, space, equipment, and the raw materials that are needed. CS is a parallel (and precisely time-synchronous) form of experimentation, and is therefore an alternative to parallel physical experimentation. It requires no resources except a conventional computer and modeling/simulation skills.

SERIAL AND CONCURRENT SIMULATION

An analogy of Concurrent Simulation (CS) that is helpful in revealing where CS gets its efficiency and understanding how it works is as follows. If we were to go grocery shopping, and we had two shopping lists, one containing items to make chocolate chip cookies and another for making bread, there are two ways which we could travel down the aisles searching for food items on the lists. First, we could locate items on a single shopping list, while not even considering the items on the other list. Once we found all the items and put them into the shopping basket, we could then take out the second shopping list and travel through the aisles of the store again, searching for the items on the second list. The first method is analogous to a serial simulation. It should be obvious that the shopper has wasted time by traveling through some of the same aisles of the store more than once. For instance, if both recipes require flour, then the shopper should had to visit the flour isle once, and picked up enough flour for both recipes, at the same time.

If the shopper merged or recognized the similarities in the shopping lists then time could have been saved performing the same task, i.e. searching for the flour. The only time a separate visit to an aisle is necessary is when the lists are different. For example, the chocolate chip recipe requires chocolate chips and the bread recipe does not. This means that a special search for chocolate chips must be performed. This is what is meant by the "simulation of differences." It is only necessary to simulate the "reference machine" and any differences from the reference machine. In terms of the grocery shopping example, if the bread list is considered the reference, then the shopper travels through the store using the bread list as the basis for his item searches, comparing all other shopping lists items to the bread list. If at any point, any of the other shopping lists do not contain an item on the bread list, i.e. a difference, then an additional search must be done to find a different item. The shopper traversing aisles and locating items is analogous to a CPU processing a task. Thus, using CS, a CPU saves time by performing common tasks of different experiments once and processing any additional task that is different from the reference list of tasks. This is why CS is efficient compared to serial simulation.

The following figure shows (a) serial simulation and (b) the equivalent Concurrent Simulation.

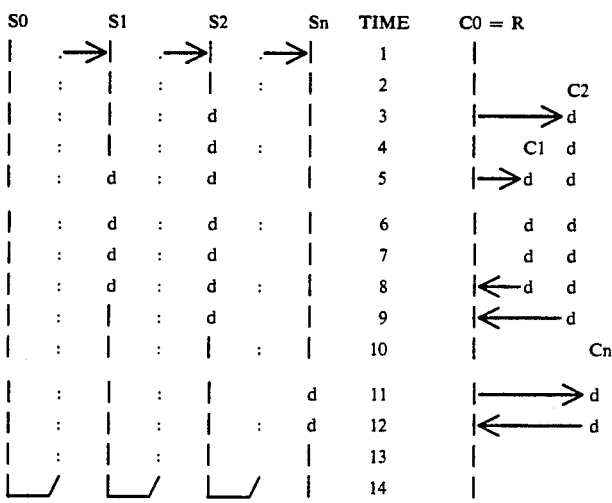

(a) Serial Simulation  (b) Concurrent Simulation

Experiments C0 to Cn are equivalent to the serial simulations S0 to Sn. C0=R is the fully simulated reference experiment, while C1 to Cn are small scale concurrent C-experiments. For example, C2 diverges from R at time t3, exists as long as it differs from R, and converges with R at time t9. Most of the simulation work is done by the reference experiment (R-experiment). It handles, at no cost per concurrent experiment (C-experiment), all segments of C-experiments identical to their counterparts in R. The R-experiment carries information, i.e., the identity numbers of C-experiments not performing the R-experiment. The simulation cost per C-experiment is proportional to its difference from R. If a C-experiment remains identical to R, then it is simulated at no cost. If it is almost identical to R, then it is simulated at almost no cost. Many data distinct C-experiments are handled at almost no cost by the R-experiment or as rather inexpensive fraternal C-experiments.

The above figure also illustrates another strong point of CS. For serial simulation it is unavoidable that many simulations are attempted, that CPU time is wasted, and that many confusing results are produced if a user specifies unrealistic experiments by specifying unrealistic inputs. For CS this problem is minimized. Only one wrong start is possible because CS starts with one R-experiment. The probabilities are high that most unrealistic experiments are "unreachable."

SUMMARY OF THE INVENTION

It is the object of the present invention to provide an efficient methodology of simulating a large number of experiments with varying parameters in a single run on a computer containing at least a single central processing unit. An experiment is initiated by defining at least two groups of input sets which then defined as domains containing both similar and different variables. The first value of each dimension of an input set or domain is then selected as a reference input set or domain and assigned an identification number. The variables assigned to each of the input sets or domains populate a conceptual multi-dimensional matrix in the form of composite identification numbers that allow the corresponding values of each of the different input sets or domains to interact with the reference input set or domain.

Other objects, features and advantages of the invention will become apparent on a reading of the specification when taken in conjunction with the drawings in which like reference numerals refer to like elements in the several views. The objects and advantages of the invention may be realized and obtained by means of the instrumentalities and combinations particularly pointed out in the appended claims. The improvements of the present invention over the prior art and the advantages resulting therefrom will become more apparent upon reading the following description of the preferred embodiment taken in conjunction with the drawings in which like reference numerals refer to like elements in the several views.

BRIEF DESCRIPTION OF THE DRAWINGS

The advantages of the present invention over the prior art will become more apparent upon reading the following description of the preferred embodiment which:

FIG. 4a is a representation of a global view of a typical circuit simulation and FIG. 4b is a representation of a local view of a typical circuit simulation using Multi-Dimensional Concurrent Simulation.

DESCRIPTION OF THE PREFERRED EMBODIMENTS

Serial (non-concurrent) simulation and Concurrent Simulation (CS) constitute the background of the Multi-Domain Concurrent Simulation (MDCS) method to be described here. MDCS generalizes CS, making it a more powerful tool. Relative to single-domain CS, where concurrent experiments (C-experiments) do not interact, MDCS permits interaction between different variables.

Figures 1A, 1B:
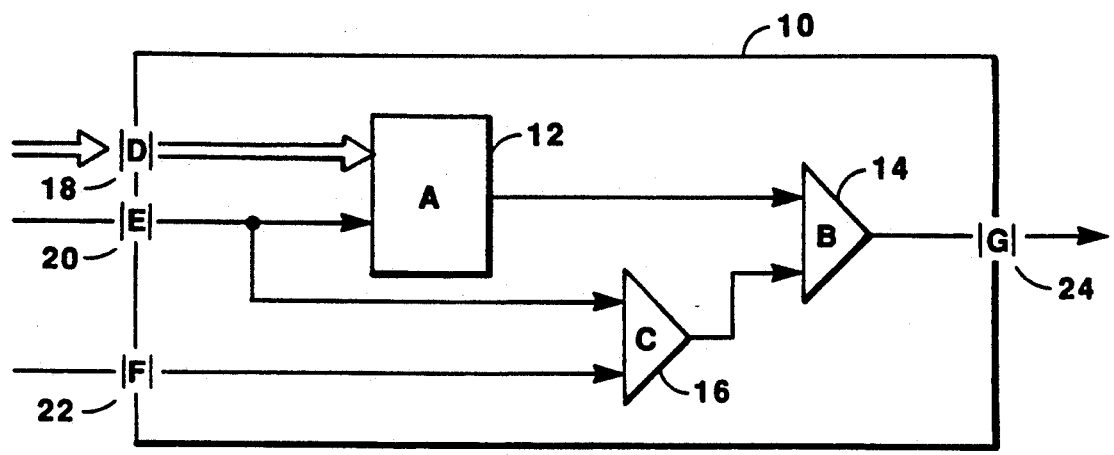
FIGS. 1a and 1b are representations of a digital network.

Referring to the drawings, and more particularly to FIG. 1a, a digital network is illustrated as an example of what the MDCS method simulates. FIG. 1a shows a digital network which consists of elements connected by nets. More particularly, the figure illustrates a network 10 containing elements 12, 14, and 16, which are designated "A", "B", and "C", respectively, for enabling description of functional relationships to be described. The elements 12, 14 and 16 are either sub-networks or primitives; specifically element 12 is a sub-network while elements 14 and 16 are primitives. Element 12 has a vector (multi-bit) and a scaler input. Certain elements within FIG. 1a are functionally inputs and outputs, that is, elements bearing reference numerals 18, 20 and 22 are primary inputs, which, for functional reference are designated, respectively, "D", "E" and "F". Similarly element 24, designated "G", is a primary output.

A network description describes a network in terms of its elements An equivalent network description is depicted in FIG. 1b adjacent the schematic, that is A is a function of D and E [which is stated as $A = f1(D,E)$]; B is a function of A and C [stated as $B = f2(A,C)$]; C is a function of E and F [stated as $C = f3(E,F)$]; and G is a function of B [stated as $G = f4(B)$].

Figure 2C:
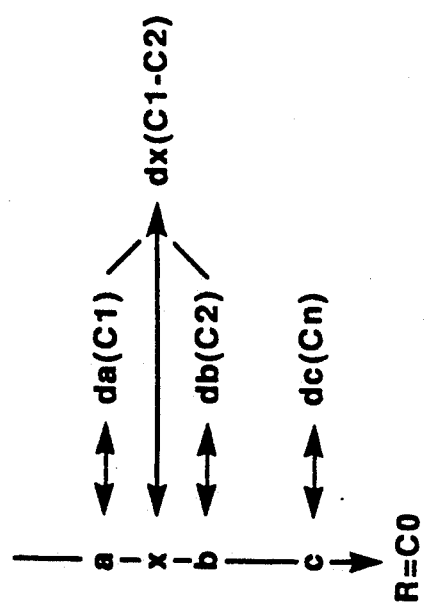
FIGS. 2a through 2c are comparisons between Serial Simulation, Concurrent Simulation, and Multi-Dimensional Concurrent Simulation of a network.
Figure 2B:
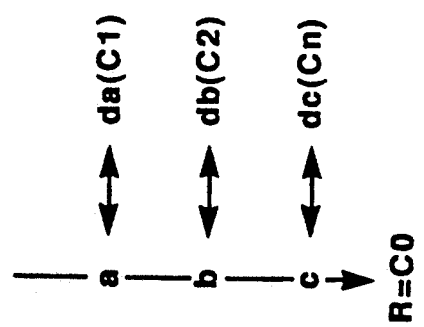
Figure 2A:
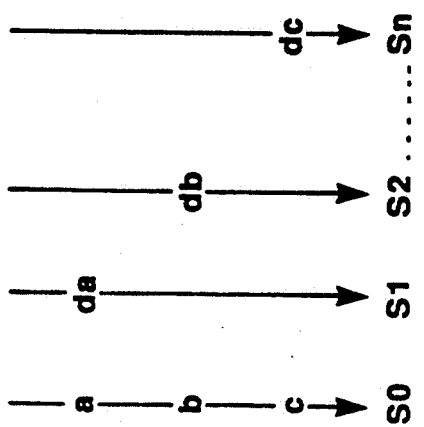

In order to contrast the different methods of simulation, FIG. 2a, 2b and 2c diagrammatically depict alternate methods which may be employed for simulation, these being serial simulation (FIG. 2a), Concurrent Simulation (FIG. 2b), and the MDCS method according to the invention (FIG. 2c).

In FIG. 2a, with serial simulation, a network is simulated repeatedly. The vertical lines represent a number of simulations, each of which is serially performed independently of the results of the others, each subsequent to the first having certain differences which must be taken into consideration during the subsequent experiments or simulations. These vertical lines are designated S0 (initial simulation), S1 (next simulation with a difference), S2 and so on to Sn. The vertical lines are broken with intervening designations "a", "b" and "c", which respectively represent the variables under consideration during the simulation. Simulations S1 to Sn, that is, simulations subsequent to the first simulation S0, contain variable differences relative to simulation S0, these differences being designated by the letter "d" with a suffix designation, such as da, db and dc, but each simulation subsequent to the first has parameters which are very similar or nearly identical to the original simulation S0. This serial simulation process is inefficient, that is, each vertical line represents a computer run.

In FIG. 2b, for Concurrent Simulation one full-scale simulation and any number of small-scale "difference simulations" are performed concurrently. The only vertical line designated R=C0 is the full-scale "reference" or R-experiment (also called the reference input values), with each of the horizontal lines intersecting one of the variables a, b, or c, indicating a "concurrent" or C-experiment, which takes into consideration the "difference" in the relevant variable for immediate consideration. The functional designations C1, C2 and Cn are the concurrent or C-experiments, which are equivalent in simulation result to the serial simulations S1 to Sn, that is, the simulations beyond the first simulation S0. All experiments and items have numbers associated with them, i.e., C0, C1, . . . ,Cn, which are referred as Identification Numbers (IDs). When differences (da, db, dc) arise, they are diverged as C-experiment items from the R-experiment. If an item or variable changes and again becomes identical to its counterpart in the R-experiment (a, b, c, etc.), then its explicit existence and simulation is ended. The R-experiment minimizes the C-experiment work. It simulates (at no cost per C-experiment) the parts of all C-experiments which are identical to their counterparts in the R-experiment. The speed of CS is based on this "one-for-all" role played by the R-experiment.

As can been seen in FIG. 2c, MDCS improves normal CS, and allows different input sets or domains and C-experiments (or the interaction of unique differences between two dissimilar input sets) to interact. The "parental" C-experiments labeled C1 and C2 create the difference dx and the interaction experiment labeled C1-C2. Parental C-experiments do not interact at random. Experiments due to a domain A will not interact with others in the same dimension but only with orthogonal domains. MDCS is economical because:

1. Experiment interaction must happen at a certain time and place, and this place is known as an interaction point. Source points are the sources of differences between experiments. They often come from the experiment inputs (the input pattern that feeds a system), but may be things like fault sources inside a system. Interaction experiments are created at interaction points rather than (much more costly) at their actual source points, such as "a" and "b" in FIG. 2a.
2. Very few parental C-experiments may create large number of potential interaction experiments.
3. Many potential interactions are unlikely to occur explicitly. They will remain identical to R=C0 in FIG. 2b or to their parental experiments. That is, they are handled as cost-free "null-experiments" which are contained in parental experiments. A null experiment is defined when two experiments could interact but never do so.

Ordinary CS has only one dimension. Therefore, we have only a single field ID number, which is usually stored in a single computer word. For MDCS, we need a separate ID field for every dimension, but this forms a composite ID. This is best explained by example. Assume we have four dimensions, and that they have 150, 160, 170, and 180 values, respectively. This means we must have a composite ID that has four fields. We also need 8 bits per field because each of the above IDs fits into 8 bits. We can label these four sub-ID fields A, B, C, and D. One specific C-experiment caused by interactions could be the experiment A17, B0, C0, D128. This would generate a composite ID that has the following contents:

| | |
|---|---|
| A-field: | 17 |
| B-field: | 0 |
| C-field: | 0 |
| D-field: | 128 |

This composite would look like: 00010001 00000000 00000000 10000000 and would just fit into a 32-bit word. Other simulations can involve composite IDs that fit in any word (or number of words) size that is unique to the computer that it is being executed on. The principle is based on the ability to put composite identification numbers of different domains into adjacent fields of a computer word or number of words.

A more detailed example of MDCS is its use for circuit simulation. For a circuit simulation it may be desirable to treat one resistor and one capacitor as two groups of input sets or domains, each assuming ten discrete values. This does not limit defining additional input sets or domains which can include a plurality of different circuit elements in addition to the resistor and a capacitor used in this example. Without MDCS, this would require the generation of one hundred versions of this circuit, and one hundred separate serial simulations. For MDCS, only one circuit version is required, the resistor and the capacitor are defined as two groups of input sets or domains, and a single simulation involving one hundred experiments is performed. One reference or R-experiment and ninety-nine concurrent or C-experiments.

Figure 3:
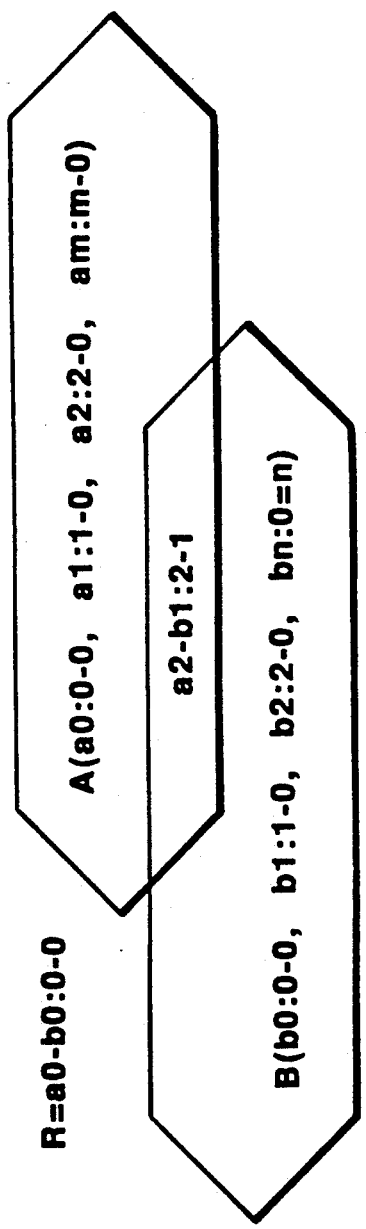
FIG. 3 is a representation of a typical circuit simulation.

FIG. 3 is just such an example. In FIG. 3, domains "A" and "B" generate experiments labeled a0, a1, a2 . . . am and b0 ,b1 b2, . . . bn.

The R-experiment is labeled a0-b0 and its identification number is 0-0. The defined experiments and their identification numbers are a0:0-0, a1:1-0, a2:2-0, etc., and b0:0-0, b1:0-1 etc. Experiment a2-b1 is due to the interaction of experiments a2 and b1. Interaction identification numbers are formed by combining the identification numbers of interacting experiments.

FIG. 4a is conceptual, global view of MDCS. Experiments due to input set or domain A interact with those due to input set or domain B to create the potential interaction experiments labeled ax-by. Some interaction experiments, like a1-b1 in FIG. 4a, may never become "explicit". They remain identical to R=a0-b0 and are defined here as "null-experiments". Any row or column in one domain is fixed, and that row or column corresponds to a normal Concurrent Simulation. FIG. 4b is similar to FIG. 4a, but views MDCS from the local prospective of the average network node. For large circuits the individual input sets or domains (experiments) have only a small probability of reaching and influencing the average node, and few or no experiments, besides the R-experiment, will exist at the average node. In FIG. 4b, as a node becomes active, only the two locally present experiments are simulated. Except for the explicit experiment a2-b1, the other experiments at node N are identical to and represented by the local R-experiment labeled R=a0-b0. It is often the only one present at many network nodes.

With very few domains a large number of experiments may be defined. As an example, using six domains with ten values per domain, a total of a million experiments can be defined. This is attractive for certain applications, especially if many interaction experiments are null-experiments which never become explicit. For example, a powerful application of MDCS is the specification of domains with the expectation that the potential interaction experiments will not arise, that they will remain null-experiments. The simulation can verify this expectation, and any actual interactions are reported. Null-experiments are informative, proving the absence of errors or the occurrence of unwanted, surprising interactions.

There has been described a new and useful method for simulating a large number of experiments with varying parameters on a computer. Specifically, unique domains are defined and different experimental values are assigned to each domain. A single simulation is executed on a computer, dynamically creating a set of interaction experiments from matrix interactions among the different assigned values of each domain. Within a domain, a parental concurrent experiment is identified, and allowed to interact with experiments of other domains. Interaction experiments include the interaction of two or more concurrent experiments. It should be appreciated that modifications and additions will be apparent to those of ordinary skill in the art in applying the teachings of the invention described herein to various applications. Accordingly, the invention should not be limited by the description herein of a preferred embodiment but, rather, the invention should be construed in accordance with the following claims.

What is claimed is:

1. A method for conducting a plurality of simulations on a computer system comprises the steps of:

providing the plurality of simulations to execute in the computer system with each simulation including a corresponding plurality of experiments executed in the computer system with each experiment having associated therewith a plurality of values for each parameter of the corresponding experiment;

selecting as a reference experiment a first value for each parameter of a first one of the plurality of experiments for each one of the plurality of simulations in the computer system;

determining a first value difference between a first reference experiment and a corresponding subsequent one of the plurality of experiments associated with a first one of the plurality of simulations in the computer system and a second value difference between a second reference experiment and a corresponding subsequent one of the plurality of experiments associated with a second one of the plurality of simulations in the computer system; and forming an interaction experiment to execute in the computer system if the first value and the second value are different, the step of forming the interaction step further comprising the steps of;

providing a first subsequent value difference between the first reference experiment and a corresponding subsequent one of the plurality of experiments associated with the first one of the plurality of simulations in the computer system;

providing a second subsequent value difference between the second reference experiment and a corresponding subsequent one of the plurality of experiments associated with the second one of the plurality of simulations in the computer system;

comparing the first subsequent value difference and the second subsequent value difference; and forming a subsequent interaction experiment if the first subsequent value and the second subsequent value are different.

2. The method for conducting a plurality of simulations on a computer system according to claim 1 wherein each of the plurality of experiments is assigned a corresponding unique identification number which represents the corresponding experiment and the order in which the experiment is executed in the simulation in the computer system.

3. The method for conducting a plurality of simulations on a computer system according to claim 1 wherein the interaction experiment is assigned a unique identification number which represents the corresponding experiment and the order in which the interaction experiment is executed in the simulation in the computer system.

4. The method for conducting a plurality of simulations on a computer system according to claim 1 wherein the interaction experiment is executed in the computer system after each of the experiments in each of the simulations in the computer system have been executed.

* * * * *